(12) United States Patent
Brask et al.

(10) Patent No.: US 9,337,307 B2
(45) Date of Patent: May 10, 2016

(54) METHOD FOR FABRICATING TRANSISTOR WITH THINNED CHANNEL

(75) Inventors: Justin K. Brask, Portland, OR (US);
Robert S. Chau, Beaverton, OR (US);
Suman Datta, Beaverton, OR (US);
Mark L. Doczy, Beaverton, OR (US);
Brian S. Doyle, Portland, OR (US);
Jack T. Kavalieros, Portland, OR (US);
Amlan Majumdar, Portland, OR (US);
Matthew V. Metz, Hillsboro, OR (US);
Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/949,696

(22) Filed: Nov. 18, 2010

(65) Prior Publication Data
US 2011/0062520 A1     Mar. 17, 2011

Related U.S. Application Data

(62) Division of application No. 11/154,138, filed on Jun. 15, 2005, now Pat. No. 7,858,481.

(51) Int. Cl.
| | |
|---|---|
| *H01L 29/66* | (2006.01) |
| *H01L 29/423* | (2006.01) |
| *H01L 29/78* | (2006.01) |

(52) U.S. Cl.
CPC .... *H01L 29/66621* (2013.01); *H01L 29/42376* (2013.01); *H01L 29/66545* (2013.01); *H01L 29/66628* (2013.01); *H01L 29/7834* (2013.01); *H01L 29/66636* (2013.01); *H01L 29/66818* (2013.01); *H01L 29/785* (2013.01)

(58) Field of Classification Search
CPC .................................................. H01L 29/42376
USPC ................ 438/299, 183, 321, 926, 197, 259, 438/270–271; 257/E21.434, E21.444, 257/E21.453, 240, 241, 242, 243, 224, 257/E21.023, E21.06
See application file for complete search history.

(56) References Cited

U.S. PATENT DOCUMENTS

| | | | |
|---|---|---|---|
| 4,231,149 A | 11/1980 | Chapman et al. | |
| 4,487,652 A | 12/1984 | Almgren | |
| 4,711,701 A | 12/1987 | McLevige | |
| 4,818,715 A | 4/1989 | Chao | |

(Continued)

FOREIGN PATENT DOCUMENTS

| | | |
|---|---|---|
| DE | 10203998 | 8/2003 |
| EP | 0510667 | 10/1992 |

(Continued)

OTHER PUBLICATIONS

Final Office Action from U.S. Appl. No. 11/154,138 mailed Dec. 8, 2009, 12 pgs.

(Continued)

*Primary Examiner* — Jerome Jackson, Jr.
*Assistant Examiner* — Ankush Singal
(74) *Attorney, Agent, or Firm* — Green, Howard & Mughal LLP

(57) ABSTRACT

A method of fabricating a MOS transistor having a thinned channel region is described. The channel region is etched following removal of a dummy gate. The source and drain regions have relatively low resistance with the process.

14 Claims, 9 Drawing Sheets

(56) References Cited

U.S. PATENT DOCUMENTS

| | | | |
|---|---|---|---|
| 4,905,063 A | 2/1990 | Beltram et al. | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaka | |
| 5,023,203 A | 6/1991 | Choi | |
| 5,120,666 A | 6/1992 | Gotou | |
| 5,124,777 A | 6/1992 | Lee | |
| 5,179,037 A | 1/1993 | Seabaugh | |
| 5,216,271 A | 6/1993 | Takagi et al. | |
| 5,266,518 A | 11/1993 | Binsma et al. | |
| 5,278,102 A | 1/1994 | Horie | |
| 5,308,999 A | 5/1994 | Gotou | |
| 5,328,810 A | 7/1994 | Lowrey et al. | |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,371,024 A * | 12/1994 | Hieda et al. | 438/291 |
| 5,391,506 A | 2/1995 | Tada et al. | |
| 5,428,237 A | 6/1995 | Yuzurihara et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,514,885 A | 5/1996 | Myrick | |
| 5,521,859 A | 5/1996 | Ema et al. | |
| 5,543,351 A | 8/1996 | Hirai et al. | |
| 5,545,586 A | 8/1996 | Koh | |
| 5,554,870 A | 9/1996 | Fitch et al. | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,595,941 A | 1/1997 | Okarnoto et al. | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,693,542 A | 12/1997 | Suh et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,747,356 A * | 5/1998 | Lee | H01L 29/0847 148/DIG. 82 |
| 5,760,442 A | 6/1998 | Shigyo et al. | |
| 5,770,513 A | 6/1998 | Okaniwa et al. | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,544 A | 9/1998 | Huang | |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,859,456 A | 1/1999 | Efland et al. | |
| 5,880,015 A | 3/1999 | Hata | |
| 5,888,309 A | 3/1999 | Yu | |
| 5,889,304 A | 3/1999 | Watanabe | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea | |
| 5,965,914 A | 10/1999 | Miyamoto | |
| 5,976,767 A | 11/1999 | Li | |
| 5,985,726 A | 11/1999 | Yu et al. | |
| 5,994,747 A * | 11/1999 | Wu | 257/408 |
| 6,010,921 A * | 1/2000 | Soutome | 438/151 |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,093,947 A | 7/2000 | Hanafi et al. | |
| 6,114,201 A | 9/2000 | Wu | |
| 6,114,206 A | 9/2000 | Yu | |
| 6,117,741 A | 9/2000 | Chatterjee et al. | |
| 6,120,846 A | 9/2000 | Hintermaier et al. | |
| 6,124,177 A | 9/2000 | Lin | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A * | 12/2000 | Kawashima | 257/335 |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,317,444 B1 | 11/2001 | Chakrabarti et al. | |
| 6,319,807 B1 | 11/2001 | Yeh et al. | |
| 6,335,251 B2 | 1/2002 | Miyano et al. | |
| 6,346,450 B1 | 2/2002 | Deleonibus et al. | |
| 6,358,800 B1 * | 3/2002 | Tseng | 438/268 |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,452,229 B1 * | 9/2002 | Krivokapic | 257/330 |
| 6,457,890 B1 | 10/2002 | Kohlruss et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki et al. | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,509,234 B1 * | 1/2003 | Krivokapic | 438/270 |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |

(56) References Cited

U.S. PATENT DOCUMENTS

| | | | |
|---|---|---|---|
| 6,551,886 B1* | 4/2003 | Yu ............................ 438/300 |
| 6,555,879 B1 | 4/2003 | Krivokapic et al. |
| 6,562,665 B1* | 5/2003 | Yu .................... H01L 29/42384 |
| | | 257/E29.137 |
| 6,562,687 B1* | 5/2003 | Deleonibus et al. .......... 438/303 |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2* | 10/2003 | Sekigawa .......... H01L 29/42384 |
| | | 257/E21.444 |
| 6,635,909 B2 | 10/2003 | Clark et al. |
| 6,642,090 B1* | 11/2003 | Fried ............... H01L 21/823828 |
| | | 257/E21.635 |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2* | 12/2003 | Hanafi .............. H01L 29/66545 |
| | | 257/E21.415 |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1* | 7/2004 | Yu .................... H01L 29/42392 |
| | | 257/E21.444 |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,424 B1* | 9/2004 | Yu ............................ 438/300 |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Mathew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,841,831 B2* | 1/2005 | Hanafi .............. H01L 29/66545 |
| | | 257/368 |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,885,072 B1* | 4/2005 | Jeng ............................. 257/412 |
| 6,888,181 B1* | 5/2005 | Liao .................. H01L 29/66795 |
| | | 257/192 |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2* | 6/2005 | Hareland et al. ............. 257/369 |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,955,961 B1 | 10/2005 | Chung |
| 6,960,517 B2 | 11/2005 | Rios et al. |
| 6,967,351 B2 | 11/2005 | Fried et al. |
| 6,969,878 B2 | 11/2005 | Coronel et al. |
| 6,970,373 B2* | 11/2005 | Datta et al. ................... 365/154 |
| 6,974,738 B2 | 12/2005 | Hareland et al. |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,013,447 B2 | 3/2006 | Mathew et al. |
| 7,018,551 B2 | 3/2006 | Beintner et al. |
| 7,029,958 B2* | 4/2006 | Tabery et al. ................. 438/151 |
| 7,033,869 B1* | 4/2006 | Xiang et al. ................... 438/149 |
| 7,041,601 B1* | 5/2006 | Yu et al. ....................... 438/696 |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,067,361 B2* | 6/2006 | Allen et al. ................... 438/167 |
| 7,071,064 B2 | 7/2006 | Doyle et al. |
| 7,074,623 B2 | 7/2006 | Lochtefeld et al. |
| 7,074,656 B2 | 7/2006 | Yeo et al. |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay et al. |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,132,360 B2 | 11/2006 | Schaeffer et al. |
| 7,138,320 B2 | 11/2006 | Van Bentum et al. |
| 7,141,480 B2 | 11/2006 | Adam et al. |
| 7,141,856 B2 | 11/2006 | Lee et al. |
| 7,154,118 B2 | 12/2006 | Lindert |
| 7,163,851 B2 | 1/2007 | Adadeer et al. |
| 7,163,898 B2 | 1/2007 | Mariani et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,193,279 B2* | 3/2007 | Doyle et al. ................... 257/401 |
| 7,211,864 B2* | 5/2007 | Seliskar ........................ 257/347 |
| 7,214,991 B2 | 5/2007 | Yeo et al. |
| 7,214,993 B2* | 5/2007 | Yang ............................. 257/401 |
| 7,238,564 B2 | 7/2007 | Ko et al. |

(56) References Cited

U.S. PATENT DOCUMENTS

| | | | |
|---|---|---|---|
| 7,241,653 B2 | 7/2007 | Hareland et al. | |
| 7,247,547 B2 | 7/2007 | Zhu et al. | |
| 7,247,578 B2 | 7/2007 | Brask | |
| 7,250,367 B2 | 7/2007 | Vaartstra et al. | |
| 7,250,645 B1 | 7/2007 | Wang et al. | |
| 7,268,024 B2 | 9/2007 | Yeo et al. | |
| 7,291,886 B2 | 11/2007 | Doris et al. | |
| 7,297,600 B2 | 11/2007 | Oh et al. | |
| 7,304,336 B2 | 12/2007 | Cheng et al. | |
| 7,309,626 B2* | 12/2007 | Ieong | H01L 21/845 257/E21.703 |
| 7,323,710 B2 | 1/2008 | Kim et al. | |
| 7,329,913 B2 | 2/2008 | Brask et al. | |
| 7,339,241 B2 | 3/2008 | Orlowski et al. | |
| 7,348,284 B2 | 3/2008 | Doyle et al. | |
| 7,348,642 B2 | 3/2008 | Nowak | |
| 7,354,817 B2 | 4/2008 | Watanabe et al. | |
| 7,358,121 B2 | 4/2008 | Chau et al. | |
| 7,396,730 B2 | 7/2008 | Li | |
| 7,452,778 B2 | 11/2008 | Chen et al. | |
| 7,456,471 B2 | 11/2008 | Anderson et al. | |
| 7,456,476 B2 | 11/2008 | Hareland et al. | |
| 7,479,421 B2 | 1/2009 | Kavalieros et al. | |
| 7,585,734 B2 | 9/2009 | Kang et al. | |
| 7,612,416 B2 | 11/2009 | Takeuchi et al. | |
| 7,615,429 B2 | 11/2009 | Kim et al. | |
| 7,655,989 B2 | 2/2010 | Zhu et al. | |
| 7,701,018 B2 | 4/2010 | Yamagami et al. | |
| 7,704,833 B2* | 4/2010 | Lindert et al. | 438/259 |
| 8,193,582 B2* | 6/2012 | Matsubara | 257/334 |
| 8,278,164 B2* | 10/2012 | Li et al. | 438/197 |
| 8,502,351 B2* | 8/2013 | Shah | H01L 29/42384 257/618 |
| 2001/0019886 A1 | 9/2001 | Bruce et al. | |
| 2001/0026985 A1* | 10/2001 | Kim | H01L 29/66318 438/312 |
| 2001/0028067 A1* | 10/2001 | Awano | 257/192 |
| 2001/0040907 A1 | 11/2001 | Chakrabarti | |
| 2002/0011612 A1 | 1/2002 | Hieda | |
| 2002/0036290 A1* | 3/2002 | Inaba | H01L 29/42384 257/66 |
| 2002/0037619 A1* | 3/2002 | Sugihara et al. | 438/289 |
| 2002/0048918 A1* | 4/2002 | Grider | H01L 21/28035 438/592 |
| 2002/0058374 A1 | 5/2002 | Kim et al. | |
| 2002/0074614 A1 | 6/2002 | Furuta et al. | |
| 2002/0081794 A1 | 6/2002 | Ito | |
| 2002/0096724 A1 | 7/2002 | Liang et al. | |
| 2002/0142529 A1 | 10/2002 | Matsuda et al. | |
| 2002/0149031 A1 | 10/2002 | Kim et al. | |
| 2002/0160553 A1 | 10/2002 | Yamanaka et al. | |
| 2002/0166838 A1 | 11/2002 | Nagarajan | |
| 2002/0167007 A1 | 11/2002 | Yamazaki et al. | |
| 2002/0177263 A1 | 11/2002 | Hanafi et al. | |
| 2002/0177282 A1 | 11/2002 | Song | |
| 2003/0001205 A1* | 1/2003 | Kim et al. | 257/336 |
| 2003/0036290 A1 | 2/2003 | Hsieh et al. | |
| 2003/0042542 A1 | 3/2003 | Maegawa et al. | |
| 2003/0057477 A1 | 3/2003 | Hergenrother et al. | |
| 2003/0057486 A1 | 3/2003 | Gambino et al. | |
| 2003/0067017 A1 | 4/2003 | Ieong et al. | |
| 2003/0080384 A1* | 5/2003 | Takahashi | C30B 25/02 257/347 |
| 2003/0085194 A1 | 5/2003 | Hopkins, Jr. | |
| 2003/0098479 A1 | 5/2003 | Murthy et al. | |
| 2003/0098488 A1 | 5/2003 | O'Keeffe et al. | |
| 2003/0102497 A1 | 6/2003 | Fried et al. | |
| 2003/0102518 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0162358 A1* | 8/2003 | Hanafi et al. | 438/291 |
| 2003/0174534 A1 | 9/2003 | Clark et al. | |
| 2003/0190766 A1 | 10/2003 | Gonzalez et al. | |
| 2003/0201458 A1 | 10/2003 | Clark et al. | |
| 2003/0203636 A1 | 10/2003 | Anthony | |
| 2003/0227036 A1 | 12/2003 | Sugiyama et al. | |
| 2004/0007724 A1* | 1/2004 | Murthy et al. | 257/288 |
| 2004/0016968 A1 | 1/2004 | Coronel et al. | |
| 2004/0026736 A1* | 2/2004 | Grupp et al. | 257/330 |
| 2004/0029345 A1 | 2/2004 | Deleonibus et al. | |
| 2004/0029393 A1 | 2/2004 | Ying et al. | |
| 2004/0031979 A1 | 2/2004 | Lochtefeld et al. | |
| 2004/0033639 A1 | 2/2004 | Chinn et al. | |
| 2004/0036118 A1 | 2/2004 | Abadeer et al. | |
| 2004/0036126 A1 | 2/2004 | Chau et al. | |
| 2004/0036127 A1* | 2/2004 | Chau et al. | 257/401 |
| 2004/0038436 A1 | 2/2004 | Mori et al. | |
| 2004/0038533 A1 | 2/2004 | Liang | |
| 2004/0061178 A1 | 4/2004 | Lin et al. | |
| 2004/0063286 A1* | 4/2004 | Kim et al. | 438/283 |
| 2004/0070020 A1 | 4/2004 | Fujiwara et al. | |
| 2004/0075141 A1 | 4/2004 | Maeda et al. | |
| 2004/0075149 A1 | 4/2004 | Fitzgerald et al. | |
| 2004/0082125 A1 | 4/2004 | Hou | |
| 2004/0092062 A1 | 5/2004 | Ahmed et al. | |
| 2004/0092067 A1 | 5/2004 | Hanafi et al. | |
| 2004/0094807 A1* | 5/2004 | Chau et al. | 257/401 |
| 2004/0099903 A1 | 5/2004 | Yeo et al. | |
| 2004/0099966 A1 | 5/2004 | Chau et al. | |
| 2004/0108523 A1 | 6/2004 | Chen et al. | |
| 2004/0108558 A1* | 6/2004 | Kwak et al. | 257/410 |
| 2004/0110097 A1 | 6/2004 | Ahmed et al. | |
| 2004/0110331 A1 | 6/2004 | Yeo et al. | |
| 2004/0113181 A1 | 6/2004 | Wicker | |
| 2004/0119100 A1 | 6/2004 | Nowak et al. | |
| 2004/0124492 A1 | 7/2004 | Matsuo | |
| 2004/0126975 A1 | 7/2004 | Ahmed et al. | |
| 2004/0132236 A1 | 7/2004 | Doris | |
| 2004/0142524 A1* | 7/2004 | Grupp et al. | 438/197 |
| 2004/0145000 A1 | 7/2004 | An et al. | |
| 2004/0145019 A1 | 7/2004 | Dakshina-Murthy et al. | |
| 2004/0166642 A1 | 8/2004 | Chen et al. | |
| 2004/0169221 A1 | 9/2004 | Ko et al. | |
| 2004/0169269 A1 | 9/2004 | Yeo et al. | |
| 2004/0180491 A1 | 9/2004 | Arai et al. | |
| 2004/0191980 A1 | 9/2004 | Rios et al. | |
| 2004/0195624 A1* | 10/2004 | Liu et al. | 257/347 |
| 2004/0197975 A1* | 10/2004 | Krivokapic | H01L 29/42384 438/200 |
| 2004/0198003 A1 | 10/2004 | Yeo et al. | |
| 2004/0203254 A1 | 10/2004 | Conley et al. | |
| 2004/0209463 A1 | 10/2004 | Kim et al. | |
| 2004/0217420 A1 | 11/2004 | Yeo et al. | |
| 2004/0219722 A1* | 11/2004 | Pham | H01L 29/785 438/157 |
| 2004/0219780 A1 | 11/2004 | Ohuchi | |
| 2004/0222473 A1 | 11/2004 | Risaki | |
| 2004/0227187 A1 | 11/2004 | Cheng et al. | |
| 2004/0238887 A1 | 12/2004 | Nihey | |
| 2004/0238915 A1 | 12/2004 | Chen et al. | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2004/0266076 A1 | 12/2004 | Doris et al. | |
| 2005/0003612 A1 | 1/2005 | Hackler et al. | |
| 2005/0017377 A1 | 1/2005 | Joshi et al. | |
| 2005/0019993 A1 | 1/2005 | Lee et al. | |
| 2005/0020020 A1 | 1/2005 | Collaert et al. | |
| 2005/0023535 A1* | 2/2005 | Sriram | 257/77 |
| 2005/0023633 A1 | 2/2005 | Yeo et al. | |
| 2005/0035415 A1 | 2/2005 | Yeo et al. | |
| 2005/0040444 A1 | 2/2005 | Cohen | |
| 2005/0059214 A1 | 3/2005 | Cheng et al. | |
| 2005/0073060 A1 | 4/2005 | Datta et al. | |
| 2005/0093028 A1 | 5/2005 | Chambers | |
| 2005/0093067 A1 | 5/2005 | Yeo et al. | |
| 2005/0093075 A1 | 5/2005 | Bentum et al. | |
| 2005/0093154 A1 | 5/2005 | Kottantharayil et al. | |
| 2005/0104055 A1* | 5/2005 | Kwak et al. | 257/2 |
| 2005/0110082 A1 | 5/2005 | Cheng | |
| 2005/0116289 A1 | 6/2005 | Boyd et al. | |
| 2005/0118790 A1 | 6/2005 | Lee et al. | |

(56) References Cited

U.S. PATENT DOCUMENTS

| | | |
|---|---|---|
| 2005/0127362 A1 | 6/2005 | Zhang et al. |
| 2005/0127632 A1 | 6/2005 | Gehret |
| 2005/0133829 A1 | 6/2005 | Kunii et al. |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1* | 7/2005 | Brask ............ H01L 21/823821 257/72 |
| 2005/0156202 A1* | 7/2005 | Rhee et al. .................... 257/213 |
| 2005/0156227 A1 | 7/2005 | Jeng |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170104 A1* | 8/2005 | Jung .................... C23C 16/345 427/569 |
| 2005/0170593 A1 | 8/2005 | Kang et al. |
| 2005/0184316 A1 | 8/2005 | Kim |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert et al. |
| 2005/0227498 A1 | 10/2005 | Furukawa |
| 2005/0230763 A1 | 10/2005 | Huang et al. |
| 2005/0233156 A1 | 10/2005 | Senzaki |
| 2005/0233525 A1* | 10/2005 | Yeo ...................... H01L 29/785 438/283 |
| 2005/0239252 A1 | 10/2005 | Ahn et al. |
| 2005/0255642 A1 | 11/2005 | Liu et al. |
| 2005/0263821 A1* | 12/2005 | Cho ...................... H01L 29/785 257/347 |
| 2005/0266622 A1* | 12/2005 | Arghavani ........ H01L 21/02126 438/197 |
| 2005/0266645 A1 | 12/2005 | Park |
| 2005/0272187 A1* | 12/2005 | Murthy et al. .................... 438/151 |
| 2005/0272192 A1 | 12/2005 | Oh et al. |
| 2005/0277294 A1 | 12/2005 | Schaefer et al. |
| 2005/0280121 A1 | 12/2005 | Doris et al. |
| 2005/0285149 A1* | 12/2005 | Chang ............... H01L 29/42384 257/210 |
| 2006/0001095 A1* | 1/2006 | Doris ................ H01L 29/66545 257/348 |
| 2006/0014338 A1 | 1/2006 | Doris et al. |
| 2006/0038241 A1* | 2/2006 | Matsuo .................... 257/401 |
| 2006/0040054 A1 | 2/2006 | Pearlstein et al. |
| 2006/0043500 A1 | 3/2006 | Chen et al. |
| 2006/0046521 A1 | 3/2006 | Vaartstra et al. |
| 2006/0057792 A1* | 3/2006 | Mathew ............ H01L 21/28518 438/197 |
| 2006/0063469 A1 | 3/2006 | Talieh et al. |
| 2006/0068590 A1 | 3/2006 | Lindert et al. |
| 2006/0068591 A1* | 3/2006 | Radosavljevic et al. ...... 438/689 |
| 2006/0071299 A1* | 4/2006 | Doyle ................ H01L 21/845 257/585 |
| 2006/0086977 A1* | 4/2006 | Shah ................ H01L 29/42384 257/347 |
| 2006/0091432 A1 | 5/2006 | Guha et al. |
| 2006/0113605 A1* | 6/2006 | Currie ........................ 257/368 |
| 2006/0154478 A1 | 7/2006 | Hsu et al. |
| 2006/0160312 A1* | 7/2006 | Chaudhary ....... H01L 21/28123 438/279 |
| 2006/0170066 A1 | 8/2006 | Mathew et al. |
| 2006/0172479 A1 | 8/2006 | Furukawa et al. |
| 2006/0172480 A1 | 8/2006 | Wang et al. |
| 2006/0172497 A1* | 8/2006 | Hareland et al. ............. 438/286 |
| 2006/0180859 A1 | 8/2006 | Radosavljevic et al. |
| 2006/0202266 A1* | 9/2006 | Radosavljevic ....... H01L 23/485 257/344 |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1* | 10/2006 | Lee et al. ..................... 438/257 |
| 2006/0244066 A1 | 11/2006 | Yeo et al. |
| 2006/0263699 A1 | 11/2006 | Abatchev et al. |
| 2006/0281325 A1 | 12/2006 | Chou et al. |
| 2007/0001219 A1 | 1/2007 | Radosavljevic et al. |
| 2007/0023795 A1 | 2/2007 | Nagano et al. |
| 2007/0026591 A1* | 2/2007 | Grupp et al. .................. 438/194 |
| 2007/0029624 A1 | 2/2007 | Nowak |
| 2007/0045735 A1 | 3/2007 | Orlowski et al. |
| 2007/0045748 A1 | 3/2007 | Booth, Jr. et al. |
| 2007/0048930 A1 | 3/2007 | Figura et al. |
| 2007/0052041 A1 | 3/2007 | Sorada et al. |
| 2007/0054457 A1* | 3/2007 | Ueno et al. .................. 438/299 |
| 2007/0069293 A1 | 3/2007 | Kavalieros et al. |
| 2007/0093010 A1 | 4/2007 | Mathew et al. |
| 2007/0108514 A1* | 5/2007 | Inoue et al. .................. 257/330 |
| 2007/0148937 A1 | 6/2007 | Yagishita et al. |
| 2007/0187682 A1 | 8/2007 | Takeuchi et al. |
| 2007/0228473 A1* | 10/2007 | Boyd ................ H01L 21/26533 257/353 |
| 2007/0241414 A1 | 10/2007 | Narihiro |
| 2007/0259501 A1 | 11/2007 | Xiong et al. |
| 2007/0262389 A1 | 11/2007 | Chau et al. |
| 2007/0272925 A1* | 11/2007 | Choi .................. H01L 27/1203 257/51 |
| 2008/0017890 A1 | 1/2008 | Yuan et al. |
| 2008/0017934 A1 | 1/2008 | Kim et al. |
| 2008/0102586 A1* | 5/2008 | Park .......................... 438/290 |
| 2008/0111163 A1 | 5/2008 | Russ et al. |
| 2008/0116515 A1 | 5/2008 | Gossner et al. |
| 2008/0128796 A1 | 6/2008 | Zhu et al. |
| 2008/0128797 A1 | 6/2008 | Dyer et al. |
| 2008/0212392 A1 | 9/2008 | Bauer |
| 2008/0237655 A1 | 10/2008 | Nakabayashi et al. |
| 2008/0258207 A1 | 10/2008 | Radosavljevic et al. |
| 2009/0061572 A1 | 3/2009 | Hareland et al. |
| 2009/0090976 A1 | 4/2009 | Kavalieros et al. |
| 2009/0099181 A1 | 4/2009 | Wurster et al. |
| 2010/0200923 A1 | 8/2010 | Chen et al. |

FOREIGN PATENT DOCUMENTS

| | | |
|---|---|---|
| EP | 0623963 | 11/1994 |
| EP | 1091413 | 4/2001 |
| EP | 1202335 | 5/2002 |
| EP | 1566844 | 8/2005 |
| GB | 2156149 | 10/1985 |
| JP | 56073454 | 6/1981 |
| JP | 59145538 | 8/1984 |
| JP | 2303048 | 12/1990 |
| JP | 06005856 | 1/1994 |
| JP | 6151387 | 5/1994 |
| JP | 06177089 | 6/1994 |
| JP | 406177089 A | 6/1994 |
| JP | 06224440 | 8/1994 |
| JP | 9162301 | 6/1997 |
| JP | 2000037842 | 2/2000 |
| JP | 2001-189453 | 7/2001 |
| JP | 2001338987 | 12/2001 |
| JP | 2002298051 | 10/2002 |
| JP | 2003229575 | 8/2003 |
| JP | 2003298051 | 10/2003 |
| TW | 200414538 | 8/1992 |
| TW | 200518310 | 11/1992 |
| TW | 516232 | 1/2003 |

(56) References Cited

FOREIGN PATENT DOCUMENTS

| | | |
|---|---|---|
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| TW | 200729407 | 8/2007 |
| WO | WO0243151 | 5/2002 |
| WO | WO02095814 | 11/2002 |
| WO | WO03003442 | 1/2003 |
| WO | WO2004059726 | 7/2004 |
| WO | WO2005036651 | 4/2005 |
| WO | WO2007038575 | 4/2007 |

OTHER PUBLICATIONS

Non-Final Office Action from U.S. Appl. No. 11/154,138 mailed Jun. 23, 2009, 14 pgs.

Final Office Action from U.S. Appl. No. 11/154,138 mailed Dec. 18, 2009, 12 pgs.

Non-Final Office Action from U.S. Appl. No. 11/154,138 mailed Aug. 14. 2008, 14 pgs.

Non-Final Office Action from U.S. Appl. No. 11/154,138 mailed Mar. 18. 2008, 16 pgs.

Final Office Action from U.S. Appl. No. 11/154,138 mailed Feb. 18, 2009, 13 pgs.

* cited by examiner

METHOD FOR FABRICATING TRANSISTOR WITH THINNED CHANNEL

CROSS-REFERENCE TO RELATED APPLICATIONS

This application is a divisional of U.S. patent application Ser. No. 11/154,138, filed Jun. 15, 2005, the entire contents of which are hereby incorporated by reference herein.

BACKGROUND OF THE INVENTION

1) Field of the Invention

The invention relates to the field of semiconductor processing for transistors having thin channel regions.

2) Description of Related Art

The trend in the fabrication of complementary metal-oxide-semiconductor (CMOS) transistors is to have small channel regions. Examples of a transistor having a reduced body which includes the channel region along with a tri-gate structure are shown in US 2004/0036127. Other small channel transistors are delta-doped transistors formed in lightly doped or undoped epitaxial layers grown on a heavily doped substrate. See, for instance, "Metal Gate Transistor with Epitaxial Source and Drain Regions," application Ser. No. 10/955,669, filed Sep. 29, 2004, assigned to the assignee of the present application.

One problem with some of these devices is the generally high external resistance that comes about from the thinning of the source and drain regions, sometimes at the edges of the gates. Other devices have similar problems that result in higher external resistance, such as limited available cross-sectional area for source and drain regions. These problems are discussed in conjunction with FIGS. 1A and 1B.

DETAILED DESCRIPTION

A process for fabricating CMOS field-effect transistors and the resultant transistors are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as cleaning steps, are not described in detail, in order to not unnecessarily obscure the present invention.

Figure 1A:
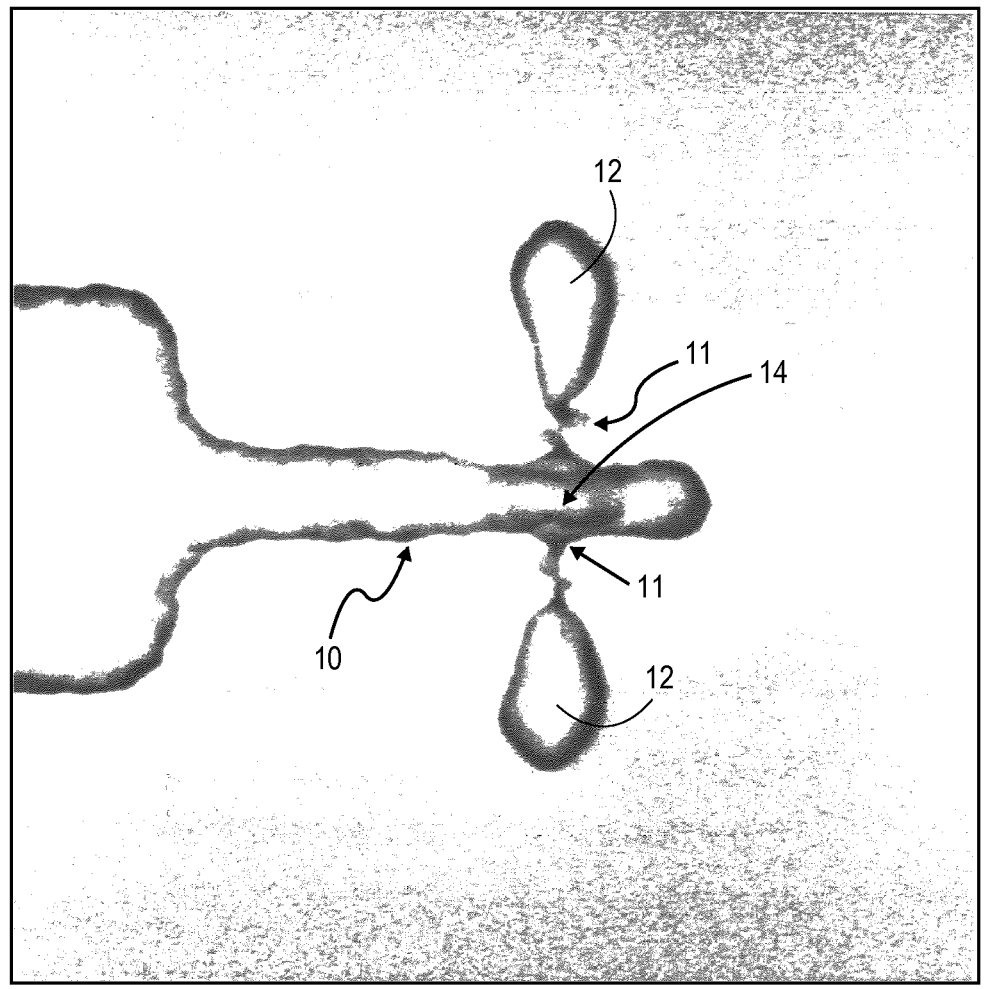
FIG. 1A is a plane view of a prior art transistor taken with a scanning electron microscope.

A problem associated with small body devices is illustrated in FIG. 1A. A tri-gate structure 10 is shown traversing a silicon body at the channel region 14 of a transistor. The semiconductor body or fin has been thinned at the gate edges 11. This thinning is the result of processing used for defining the body, forming spacers, and cleaning of oxides. This processing can so reduce the body such that it may no longer have sufficient silicon seed to support the growth of an epitaxial layer. Often, as much as 20-50% of the body at the edge of the gate can be lost during such processing. In addition to yield loss, this results in higher source/drain resistance and the consequential reduction in transistor performance.

Figure 1B:
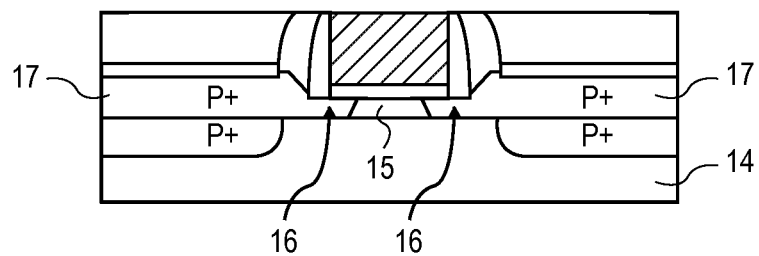
FIG. 1B is a cross-sectional, elevation view of a depletion mode transistor fabricated on a heavily doped substrate. This figure was taken from the patent application cited in the Prior Art and Related Art section of this application.

A similar problem is shown in FIG. 1B, where the n type or intrinsic channel region 15 is formed between the relatively thin regions 16 of the source and drain extension regions of a depletion mode planar transistor. Thus, the problem of thinning at the gate edges is not limited to tri-gate structures, or for that matter, SOI substrates, but can also occur in a bulk silicon layer or a delta-doped transistor, as shown in FIG. 1B. In the structure of FIG. 1B, an epitaxial layer is grown on a heavily doped substrate 14. An etchant discriminates between the epitaxially grown layer and the substrate 14, allowing the channel region 15 to be defined. The source and drain regions 17 are grown following the etching of the region 15. The structure is described in the application referenced in the Prior Art and Related Art section of this application.

Figure 2:
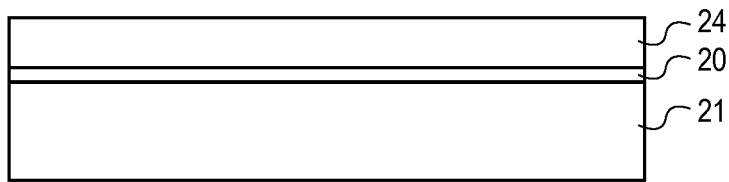
FIG. 2 is a cross-sectional, elevation view of a silicon-on-insulator (SOI) substrate.

In a first embodiment, transistors are fabricated on an oxide layer 20 which is disposed on a silicon substrate 21 shown in FIG. 2. The transistor bodies are fabricated from a monocrystalline, silicon layer 24 disposed on the oxide layer 20. This SOI substrate is well-known in the semiconductor industry.

By way of example, the SOI substrate is fabricated by bonding the oxide layer 20 and silicon layer 24 onto the substrate 21, and then planarizing the layer 24 so that it is relatively thin. Other techniques are known for forming an SOI substrate including, for instance, the implantation of oxygen into the silicon substrate to form a buried oxide layer. Other semiconductor materials, other than silicon, may also be used such as gallium arsenide.

The layer 24 may be selectively ion implanted with a p type dopant in regions where n channel transistors are to be fabricated, and with a n type dopant in those regions where p channel devices are to be fabricated. This is used to provide the relatively light doping typically found in the channel regions of MOS devices fabricated in a CMOS integrated circuit.

In the description below, for the first embodiment, the fabrication of a single n channel transistor is described. As will be appreciated in the typical integrated circuit, both n and p channel devices are fabricated. Also, in the processing for the first embodiment, a protective oxide (not shown) is disposed on the silicon layer 24 followed by the deposition of a silicon nitride layer. The nitride layer acts as a hard mask to define silicon bodies such as the silicon body 25 of FIG. 3.

Assume for a particular process that the silicon body, in the channel region of a field-effect transistor, should ideally have a height of 20 nm and a width of 20 nm. Using the prior art processing associated with the transistor of FIG. 1, the thickness of the silicon layer from which the body is etched would also have a thickness of 20 nm. As will be seen for the embodiment of FIGS. 2-11, the layer 24 may initially be thicker than 20 nm, and will subsequently be thinned in the channel region. This thinning only occurs in the channel region, leaving the source and drain regions thicker, thereby reducing the external resistance. This will become more apparent in the description below.

Figure 3:
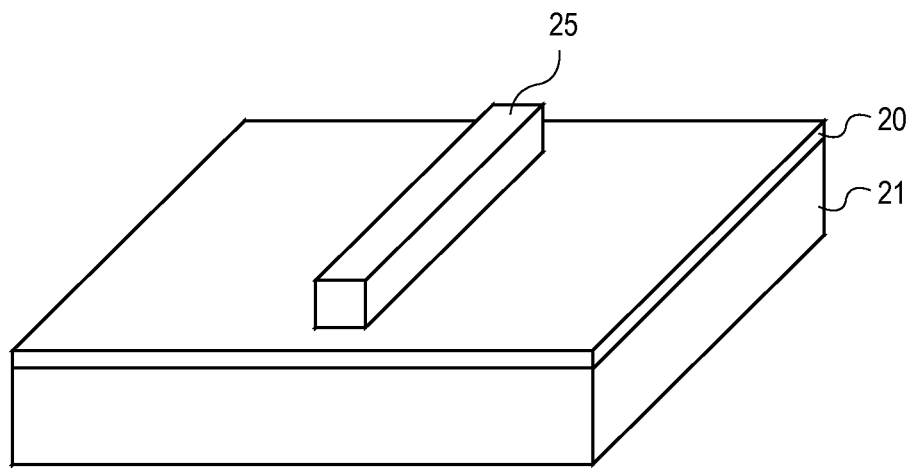
FIG. 3 is a perspective view of the structure of FIG. 2, after the formation of a silicon body, sometimes referred to as a fin.
Figure 4:
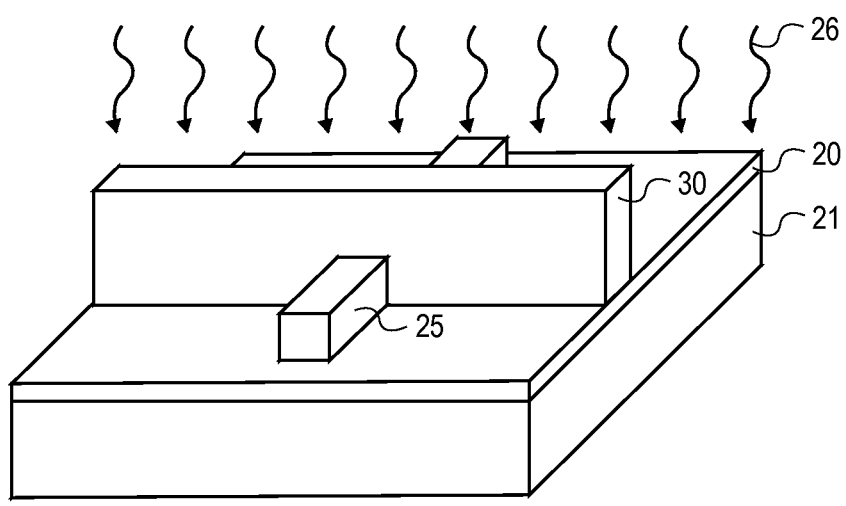
FIG. 4 illustrates the structure of FIG. 3, after a dummy gate is fabricated and during a first ion implantation process.

A polysilicon layer is formed over the structure of FIG. 3 and etched to define a dummy gate 30 which extends over the body 25 as seen in FIG. 4. (A dummy gate oxide which subsequently acts as an etch stop is not shown.) The region of the body 25 below the dummy gate 30, as will be seen, is the channel region for this replacement gate process. Once the dummy gate 30 has been defined, phosphorous or arsenic may be implanted into the body 25 in alignment with the dummy gate, as illustrated by the ion implantation 26. This ion implantation defines the tip or extension source and drain regions frequently used in CMOS transistors.

Figure 5:
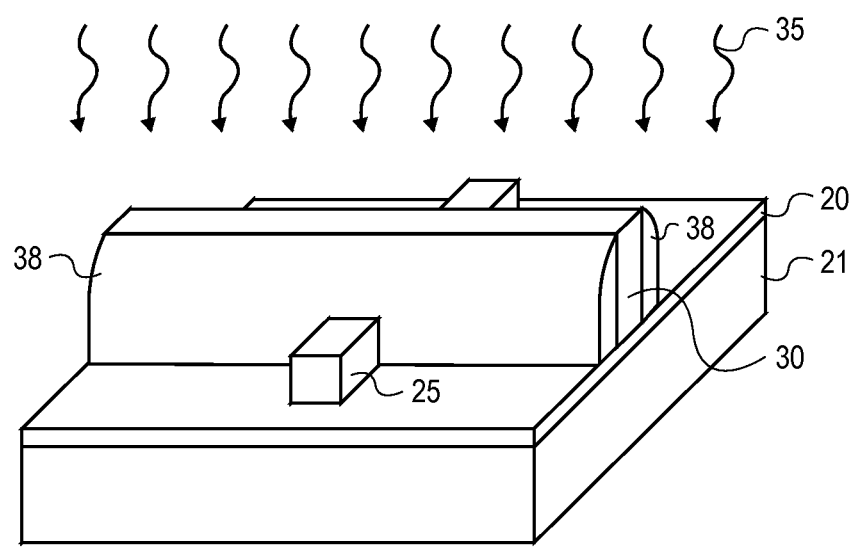
FIG. 5 illustrates the structure of FIG. 4, after spacers are fabricated and during a second ion implantation step.

Next, a layer of silicon nitride is conformally deposited over the structure of FIG. 4, and is used to fabricate the spacers 38 shown in FIG. 5. Ordinary, well-known, anisotropic etching may be used to fabricate the spacers. In one embodiment, a carbon-doped nitride, doped with 5-13% carbon concentration is used for the spacers. As will be discussed later, prior to the formation of the nitride layer, an oxide layer present on the body 25 is removed. This cleaning process is one of the processes that typically reduces the thickness of the body at the edges of the gate. After the spacer formation, the main part of the source and drain regions are formed through ion implantation 35 shown in FIG. 5. For the n channel device, arsenic or phosphorous is used with an implant dose of up to $1\times10^{19}$–$1\times10^{20}$ atoms/$cm^3$.

Figure 6:
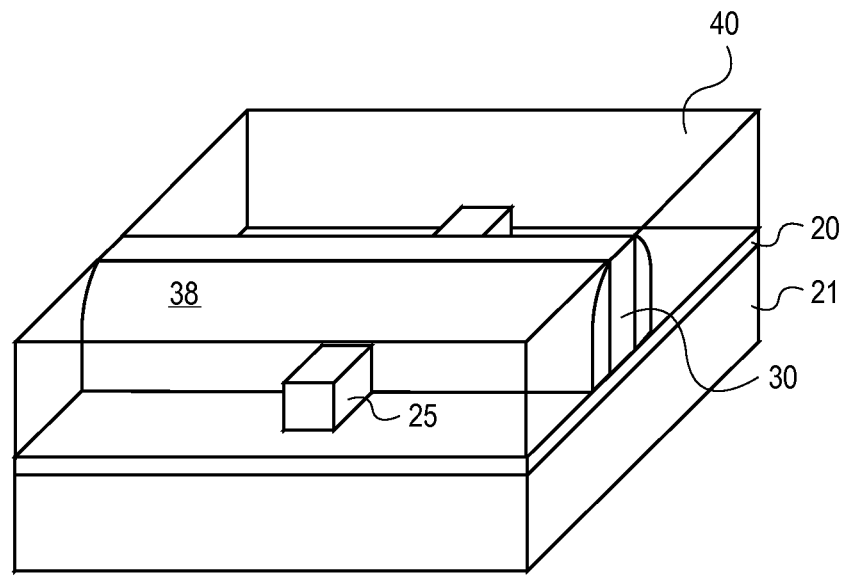
FIG. 6 illustrates the structure of FIG. 5, after forming a dielectric layer.

A dielectric layer 40 is now conformally deposited over the structure of FIG. 5, as shown in FIG. 6. This may comprise a silicon dioxide layer which will become an interlayer dielectric (ILD) in an integrated circuit. A low-k dielectric or a sacrificial dielectric layer may be used. In any event, the layer 40 typically has the mechanical strength to withstand a planarization process such as chemical mechanical polishing (CMP).

Figure 7:
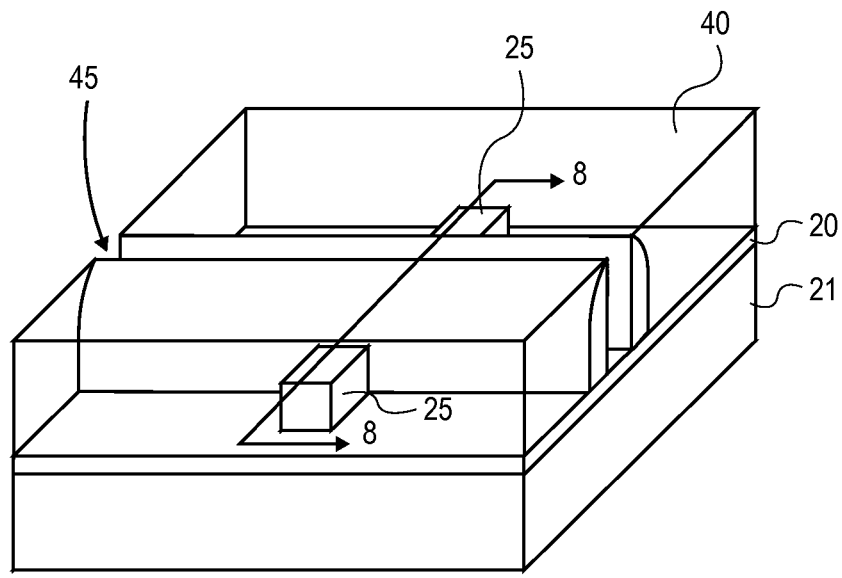
FIG. 7 illustrates the structure of FIG. 6, after removal of the dummy gate.
Figure 8:
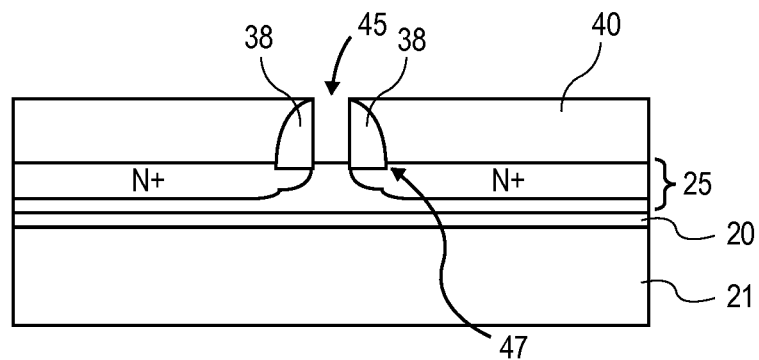
FIG. 8 is a cross-sectional, elevation view of the structure of FIG. 7 taken through section line 8-8 of FIG. 7.
Figure 9:
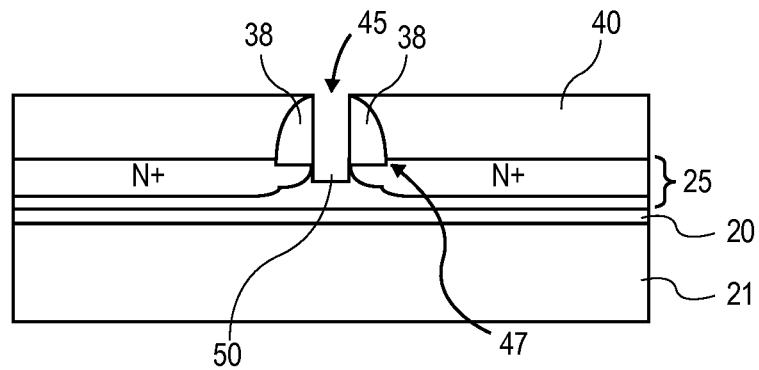
FIG. 9 illustrates the structure of FIG. 8, after an etching step which thins the channel region.

After the deposition and planarization of the dielectric layer 40, a wet etch is used to remove the dummy polysilicon gate 30, leaving the opening 45, as shown in FIG. 7. (The dummy gate oxide (not shown) is also removed.) The cross-sectional view of FIG. 8 taken through section line 8-8 of FIG. 7, better shows the opening 45. Also better shown in FIG. 8, is that the spacers 38 are recessed at 47 into the body 25. As mentioned earlier, after the source and drain tip implant and before the spacer material is deposited, an oxide layer is removed from the body 25. This results in the loss of some of the body material and, in part, accounts for the thinning occurring in the prior art structure shown at 11 of FIG. 1A. The removal of this oxide is important in some processes, as will be discussed later.

Following the removal of the dummy gate, any oxide over the body 25 within the opening 45 is removed in an ordinary cleaning step. Then, the structure of FIG. 8 is placed in a selective silicon bath such as $NH_4OH$ which reduces the size of the body within the opening 45. This etching reduces both the height of the body as seen at 50 of FIG. 9, as well as the width of the body. This allows the channel region of the body 25 to be thinned to a target height and thickness. Again, assume that the target height and thickness of the body 25 in the channel region is 20×20 nm. A thicker and wider body 25 may be initially formed since it is thinned in this etching step. Importantly, this etching step does not thin the body 25 outside of the channel region. Consequently, if the body 25 is initially thicker and wider, the source and drain regions remain thicker or wider after the channel region has been thinned. Thus, by starting with a thicker and wider body, there is more silicon left after the cleaning process, and the severe thinning shown at 11 of FIG. 1A is avoided.

Next, a gate dielectric 60 is formed on exposed surfaces which includes the sides and top of the body 25 lying within the opening 45. The layer 60 also deposits on the interior sidewalls of the spacers 38 and on the upper surface of the dielectric layer 40. The gate dielectric, in one embodiment, has a high dielectric constant (k), such as a metal oxide dielectric, for instance, $HfO_2$ or $ZrO_2$ or other high k dielectrics, such as PZT or BST. The gate dielectric may be formed by any well-known technique such as atomic layer deposition (ALD) or chemical vapor deposition (CVD). Alternately, the gate dielectric may be a grown dielectric. For instance, the gate dielectric 60, may be a silicon dioxide film grown with a wet or dry oxidation process to a thickness between 5-50 Å.

Figure 10:
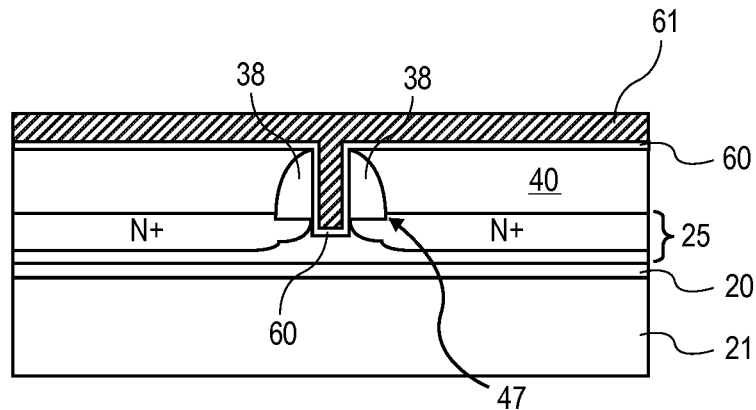
FIG. 10 illustrates the structure of FIG. 9, after forming a high-k gate insulating layer and a metal gate layer.

Following this, also as seen in FIG. 10, a gate electrode (metal) layer 61 is formed over the gate dielectric layer 60. The gate electrode layer 61 may be formed by blanket deposition of a suitable gate electrode material. In one embodiment, a gate electrode material comprises a metal film such as tungsten, tantalum, titanium and/or nitrides and alloys thereof. For the n channel transistors, a work function in the range of 3.9 to 4.6 eV may be used. For the p channel transistors, a work function of 4.6 to 5.2 eV may be used. Accordingly, for substrates with both n channel and p channel transistors, two separate metal deposition processes may need to be used.

Figure 11:
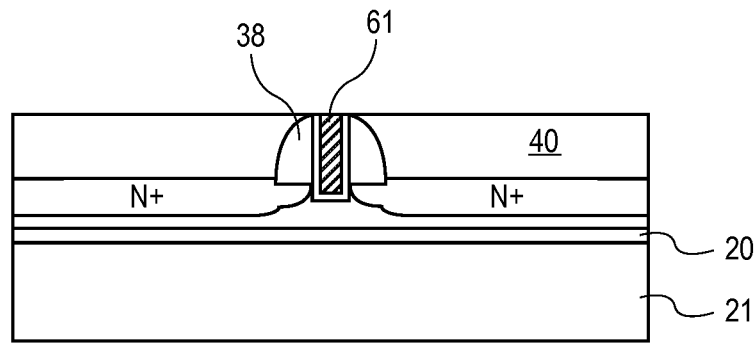
FIG. 11 illustrates the structure of FIG. 10 after planarization.

The metal layer 61 is planarized using, for example CMP, and the planarization continues until at least the upper surface of the dielectric layer 40 is exposed, as shown in FIG. 11.

Standard processing is now used to complete the transistor of FIG. 11.

Figure 12:
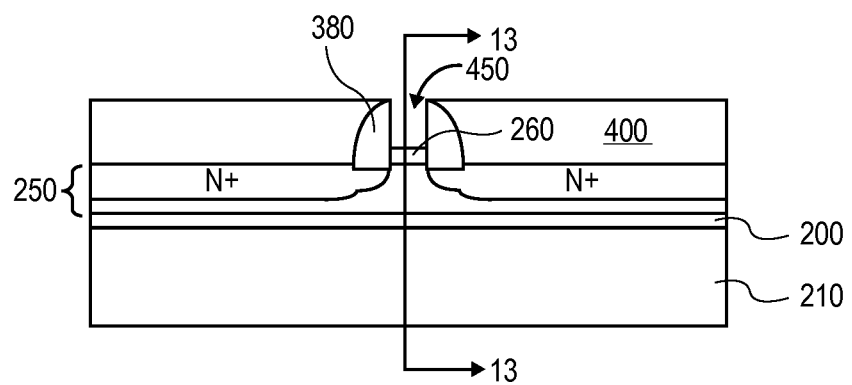
FIG. 12, which illustrates alternate processing, is a cross-sectional, elevation view, at a point in the processing similar to FIG. 8. In this alternate processing, a hard mask, used to define the silicon body, remains atop the channel region.
Figure 13:
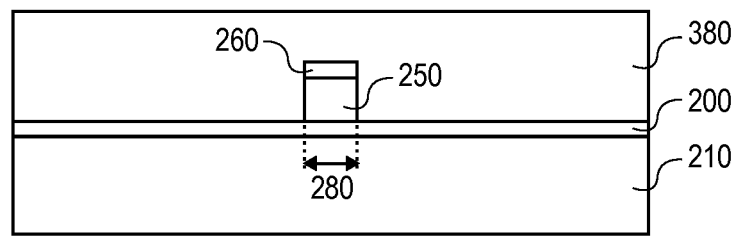
FIG. 13 illustrates the structure of FIG. 12, as viewed through the section lines 13-13 of FIG. 12.
Figure 14:
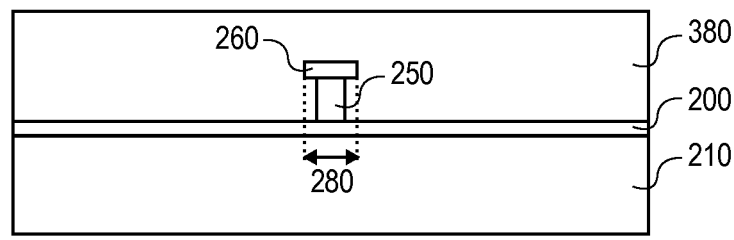
FIG. 14 illustrates the structure of FIG. 13, after etching which reduced the width of the body in the channel region.

Alternate processing is next described in conjunction with FIGS. 12-14. The numbering used in FIG. 12 includes a "0"

after the numbers used in FIGS. 2-11 for corresponding layers and members. For instance, the spacers 38 of FIG. 11 are shown as spacers 380 in FIG. 12. In FIG. 12, a substrate 210, insulator 200 and body 250 are seen along with the source and drain regions.

The processing leading up to FIG. 12 is the same as the processing as in the prior embodiment, with one exception. This difference is that the hard mask defining the bodies or fins, such as body 250, is not immediately removed after defining the bodies. Rather, the polysilicon dummy gate structure is formed over the hard mask. Then, where the body is not protected by the polysilicon dummy gate, the hard mask is removed. Consequently, the hard mask 260 remains over the channel region, and after the spacers are formed and dummy gate removed, the hard mask 260 is exposed in opening 450 of FIG. 12.

The structure of FIG. 12 is again illustrated in FIG. 13 from the view taken through the lines 13-13 of FIG. 12. In this view, the silicon body 250 and mask 260 are shown with the spacer 380 in the background. The dimension 280 of FIG. 13 is the width of the body 250 in the channel region.

Wet etching is now used to etch the silicon body 250 with, for example, $NH_4OH$. This thins the width of the silicon body without changing its height, as shown in FIG. 14. Note, in FIG. 14 the remaining body 250 is narrower than its original dimension 280, while its height has not changed. For some semiconductor processes, better control may be obtained when only the width of the silicon body is etched. Thus, only the width of the body in the channel region is reduced to a predetermined target dimension, without reducing the height or width of the source and drain regions as this occurs.

After this etching step, the hard mask 260 is removed, then the high k dielectric and metal gates are formed, as was the case in the previous embodiment.

As mentioned earlier, the silicon dioxide layer, which typically is present on the silicon body, is removed before the deposition of the spacer material. This was discussed in conjunction with the recess 47 of FIG. 8. This is done because an undesirable reaction may occur between the oxide layer and the high k dielectric, if a high temperature anneal is used to activate the doping in the source and drain regions after the replacement gate is formed. At least the sides of the oxide layer, if not removed, may contact the high k dielectric and cause this problem. This is not a problem, however, if the annealing of the source and drain regions occurs before the high k dielectric is formed.

The thinning of the channel region described above can also be used on a planar, bulk transistor or a transistor formed in a delta-doped substrate. FIGS. 15-21 below describe the formation of a depletion mode transistor with raised source and drain regions, where controlled thinning of the channel region occurs.

Figure 15:
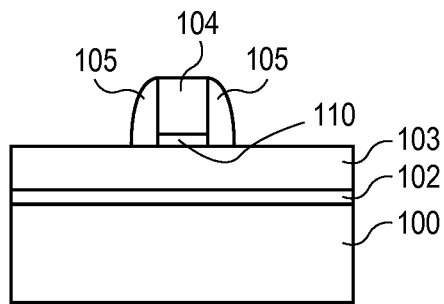
FIG. 15 is a cross-sectional, elevation view of a SOI substrate.

FIG. 15 illustrates an SOI substrate having a base 100, oxide layer 102 and a monocrystalline silicon layer 103. For the depletion mode transistor, the layer 103, or at least the region where the depletion mode transistor is fabricated, is lightly doped with an n type dopant or is intrinsic silicon, or other semiconductor material. A gate structure is fabricated on a dummy gate oxide layer 110. This structure comprises a polysilicon dummy gate 104 and spacers 105.

Figure 16:
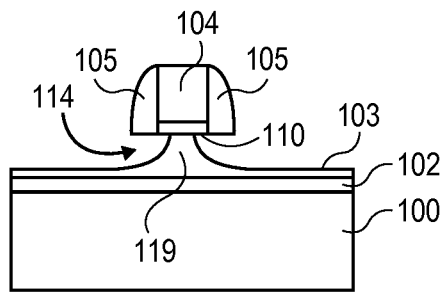
FIG. 16 illustrates the structure of FIG. 15, after etching of the silicon layer.

Following this, as shown in FIG. 16, the semiconductor layer 103 is etched isotropically in alignment with the gate structure. This etching undercuts the gate structure as illustrated at undercut 114. The remaining silicon from layer 103, is the channel region 119, seen in FIG. 16.

Raised source and drain regions are then epitaxially grown to establish a shallow, highly doped source/drain tip (extension) that laterally extends the distance under the gate edge to the channel region 119. Separate processing is used for the p-channel and n-channel transistors with each of the source and drain regions being grown in different processing, both with in-situ doping. This results in the source and drain regions being highly doped, in one case with a p-type dopant, and in the other case with an n-type dopant.

In forming a PMOS transistor, the source and drain regions are raised as illustrated. They may be formed by selectively depositing epitaxial boron (B) doped silicon or SiGe with germanium concentrations up to 30%, as an example. Under the processing conditions of 100 sccm of dichlorosilane (DCS), 20 slm $H_2$, 750-800° C., 20 Torr, 150-200 sccm HCl, a diborane ($B_2H_6$) flow of 150-200 sccm and a $GeH_4$ flow of 150-200 sccm, a highly doped SiGe film with a deposition rate of 20 nm/min, B concentration of 1E20 $cm^{-3}$ and a germanium concentration of 20% is achieved. A low resistivity of 0.7-0.9 mOhm-cm resulting from the high B concentration in the film provides the benefit of high conductivity in the tip source/drain regions and thereby reduced $R_{external}$. SiGe in the source/drain regions exerts compressive strain on the channel, which in turn results in enhanced mobility and improved transistor performance.

For an NMOS transistor, the source/drain regions are formed, for instance, using in-situ phosphorous doped silicon deposited selectively under processing conditions of 100 sccm of DCS, 25-50 sccm HCl, 200-300 sccm of 1% $PH_3$ with a carrier $H_2$ gas flow of 20 slm at 750° C. and 20 Torr. A phosphorous concentration of 2E20 $cm^{-3}$ with a resistivity of 0.4-0.6 mOhm-cm is achieved in the deposited film.

Figure 17:
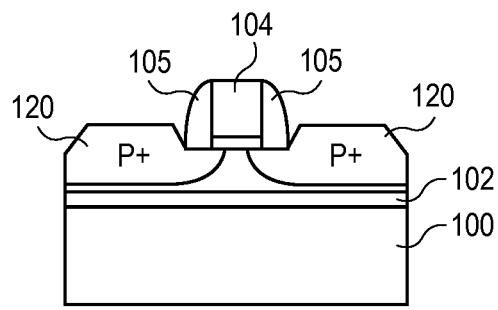
FIG. 17 illustrates the structure of FIG. 16, with epitaxially grown source and drain regions.
Figure 18:
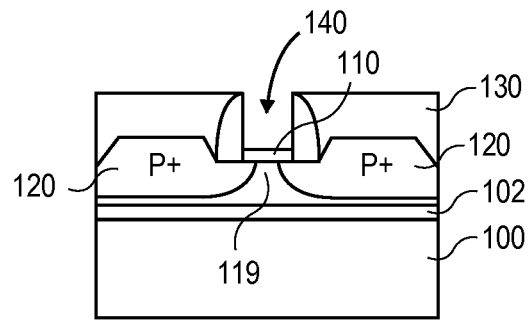
FIG. 18 illustrates the structure of FIG. 17, after a dielectric layer is formed around the structure and a gate region is exposed.

The resultant structure is shown in FIG. 17. Ion implantation of boron may be used to more heavily dope the source and drain region beyond the edges of the gate structure shown in FIG. 17.

Figure 19:
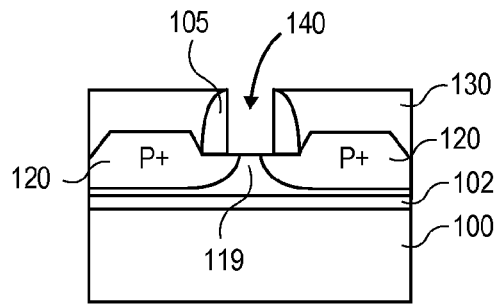
FIG. 19 illustrates the structure of FIG. 18, after additional etching.

A dielectric layer 130 is now formed over the structure of FIG. 17. This corresponds to the dielectric layers 40 and 400 in the prior embodiments. Again, this layer may be an ILD layer or a sacrificial layer. An etchant is used to etch away the dummy gate, providing an opening 140 seen in FIG. 18. This exposes the underlying oxide layer 110. The oxide layer 110 is removed with an ordinary etchant as shown in FIG. 19, thereby exposing the channel region 119.

Figure 20:
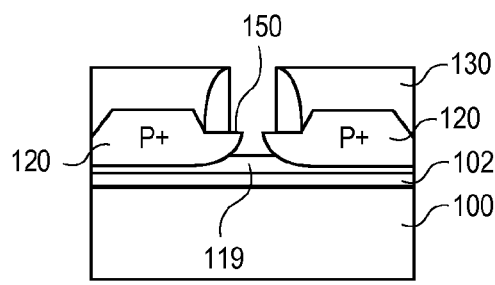
FIG. 20 illustrates the structure of FIG. 19, after etching, which thins the channel region.

Now, the channel region can be etched to reduce its cross section as shown in FIG. 20. A tetramethylammonium hydroxide (TMAH) or ammonium hydroxide solution with an appropriate pH value is used to selectively etch the exposed n type or intrinsic silicon channel region 119 without affecting the p+ source and drain regions. This etchant is highly selective, and thus leaves in place the tips 150 of the source and drain regions 120 while the thinning of the channel region 119 occurs. The boron-doped silicon has a sufficiently different lattice energy than the phosphorous- or arsenic-doped silicon, thereby allowing this selective etching to occur. In one process, this etching is done at a megasonic energy level of between 600 and 1100 kHz. The tips 150 shown in FIG. 20, thus remain even though the channel region falls below the raised source and drain regions.

A high k dielectric gate layer 122 may next be conformally deposited using, for instance, ALD. Following this, metal gate layer 124 is formed. The appropriate work function for the layer 124 is used as discussed above for the layer 61.

Figure 21:
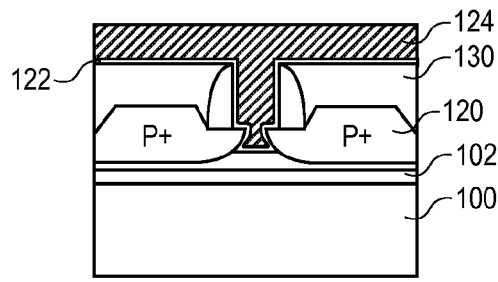
FIG. 21 illustrates the structure of FIG. 20, after forming an insulating, high-k layer, and a metal gate layer.
Figure 22:
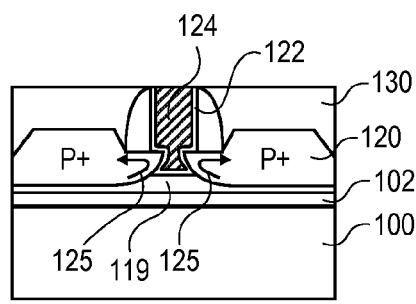
FIG. 22 illustrates the structure of FIG. 21, after planarization.

The structure of FIG. 21 is planarized with, for instance, CMP to provide the structure of FIG. 22. In the finished device, the final recessed channel 119 thus has raised, source/drain extension regions. This allows the current from the channel inversion layer to spread upward into these extension regions as shown by the lines 125. In contrast in examining FIG. 1B at 16, the current can only spread outward and downward, thereby resulting in higher series resistance.

Figure 23:
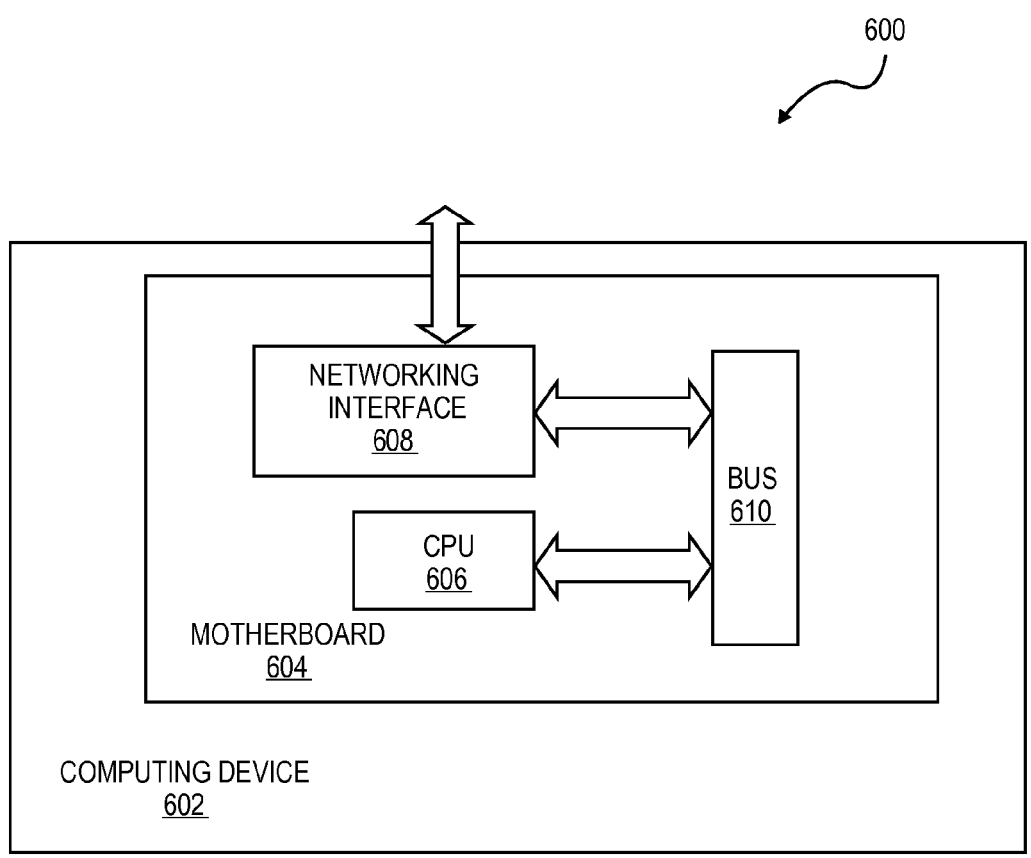
FIG. 23 is a block diagram, incorporating the above-illustrated thinned channel transistors in a system.

The transistor fabricated as described above may be incorporated into an integrated circuit, central processing unit, which in turn is part of a computing device or system. FIG. 23 illustrates such a system 600 in accordance with one embodiment. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise the transistors of FIG. 11 or 22, as examples, of the above-described transistor.

Depending on the applications, system 600 may include other components, including but are not limited to, volatile and non-volatile memory, a graphics processor, a digital signal processor, a crypto processor, a chipset, mass storage (such as hard disk, compact disk (CD), digital versatile disk (DVD) and so forth), and so forth.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Thus, improved processing has been described that allows a channel region to be controllably thinned, and that permits the source/drain regions to have less resistance.

What is claimed is:

1. A non-planar transistor, comprising:
    a three-dimensional semiconductor body disposed above a substrate, the three-dimensional semiconductor body having a top surface and a pair of sidewall surfaces and having a first outermost width, a second outermost width, a length, and an uppermost height;
    a source region disposed only in a first end of the three-dimensional semiconductor body having only the first outermost width and the uppermost height, the source region having the first outermost width and the uppermost height;
    a drain region disposed only in a second end of the three-dimensional semiconductor body having only the first outermost width and the uppermost height, the drain region having the first outermost width and the uppermost height, the second end opposite the first end;
    a channel region disposed only in a portion of the three-dimensional semiconductor body having only the second outermost width, the uppermost height and a length, the portion disposed between the source region and the drain region, and the second outermost width narrower than the first outermost width, wherein the length of the three-dimensional semiconductor body runs from the source region through the channel region to the drain region, wherein the uppermost height of the three-dimensional semiconductor body is taken from the substrate to a top surface of the three-dimensional semiconductor body, and wherein the first and second outermost width are orthogonal to the length and the uppermost height; and
    a gate stack disposed directly on a portion of the top surface of the three-dimensional semiconductor body and the gate stack further disposed directly on a portion of the sidewall surfaces of the three-dimensional semiconductor body and at least partially surrounding the channel region, the gate stack having a distance between sidewalls of the gate stack equal to and in direct alignment with the length of the portion of the three-dimensional semiconductor body having only the second outermost width, wherein the gate stack comprises a gate dielectric layer and a gate electrode, and wherein the gate dielectric layer comprises a high-k insulation layer, and the gate electrode comprises a metal layer disposed directly on the high-k insulation layer.

2. The transistor of claim 1, wherein the channel region is directly adjacent to both the source region and the drain region.

3. The transistor of claim 1, further comprising:
    a first tip region disposed only in the first end of the three-dimensional semiconductor body having only the first outermost width and the uppermost height; and
    a second tip region disposed only in the second end of the three-dimensional semiconductor body having only the first outermost width and the uppermost height, wherein the channel region is directly adjacent to both the first and second tip regions.

4. The transistor of claim 1, wherein the gate dielectric layer is disposed below the gate electrode and also forms the sidewalls of the gate stack.

5. The transistor of claim 1, wherein the gate dielectric layer is disposed only below the gate electrode.

6. The transistor of claim 1, wherein the metal layer has a work function between 3.9 eV and 5.2 eV.

7. The transistor of claim 1, wherein the three-dimensional semiconductor body is disposed directly on a silicon-on-insulator substrate.

8. The transistor of claim 1, wherein the three-dimensional semiconductor body is disposed directly on a delta-doped substrate.

9. A non-planar transistor, comprising:
    a three-dimensional semiconductor body disposed above a substrate, the three-dimensional semiconductor body having a top surface and a pair of sidewall surfaces and having a first outermost width, a second outermost width, a length, and an uppermost height, wherein the three-dimensional semiconductor body is disposed directly on a delta-doped substrate;
    a source region disposed only in a first end of the three-dimensional semiconductor body having only the first outermost width and the uppermost height, the source region having the first outermost width and the uppermost height;
    a drain region disposed only in a second end of the three-dimensional semiconductor body having only the first outermost width and the uppermost height, the drain region having the first outermost width and the uppermost height, the second end opposite the first end;
    a channel region disposed only in a portion of the three-dimensional semiconductor body having only the second outermost width, the uppermost height and a length, the portion disposed between the source region and the drain region, and the second outermost width narrower than the first outermost width, wherein the length of the three-dimensional semiconductor body runs from the source region through the channel region to the drain region, wherein the uppermost height of the three-dimensional semiconductor body is taken from the substrate to a top surface of the three-dimensional semiconductor body, and wherein the first and second outermost width are orthogonal to the length and the uppermost height; and
    a gate stack disposed directly on a portion of the top surface of the three-dimensional semiconductor body and the gate stack further disposed directly on a portion of the sidewall surfaces of the three-dimensional semiconductor body and at least partially surrounding the channel region, the gate stack having a distance between sidewalls of the gate stack equal to and in direct alignment with the length of the portion of the three-dimensional semiconductor body having only the second outermost width, wherein the gate stack comprises a gate dielectric layer and a gate electrode.

10. The transistor of claim 9, wherein the channel region is directly adjacent to both the source region and the drain region.

11. The transistor of claim 9, further comprising:
a first tip region disposed only in the first end of the three-dimensional semiconductor body having only the first outermost width and the uppermost height; and
a second tip region disposed only in the second end of the three-dimensional semiconductor body having only the first outermost width and the uppermost height, wherein the channel region is directly adjacent to both the first and second tip regions.

12. The transistor of claim 9, wherein the gate dielectric layer is disposed below the gate electrode and also forms the sidewalls of the gate stack.

13. The transistor of claim 9, wherein the gate dielectric layer is disposed only below the gate electrode.

14. The transistor of claim 9, wherein the three-dimensional semiconductor body is disposed directly on a silicon-on-insulator substrate.

* * * * *